United States Patent
Zommer

(10) Patent No.: US 9,012,764 B1
(45) Date of Patent: Apr. 21, 2015

(54) SOLAR CELL CHARGER WITH LENS FOR PORTABLE APPLICATIONS

(75) Inventor: Nathan Zommer, Los Altos, CA (US)

(73) Assignee: IXYS Corporation, Milpitas, CA (US)

( * ) Notice: Subject to any disclaimer, the term of this patent is extended or adjusted under 35 U.S.C. 154(b) by 1545 days.

(21) Appl. No.: 10/682,384

(22) Filed: Oct. 8, 2003

Related U.S. Application Data

(60) Provisional application No. 60/417,302, filed on Oct. 8, 2002.

(51) Int. Cl.
*H01L 31/00* (2006.01)
*H02J 7/35* (2006.01)
*H01L 31/0203* (2014.01)

(52) U.S. Cl.
CPC ............... *H02J 7/35* (2013.01); *H01L 31/0203* (2013.01)

(58) Field of Classification Search
USPC ................... 136/243–293; 320/101, 111, 103
See application file for complete search history.

(56) References Cited

U.S. PATENT DOCUMENTS

| | | | | |
|---|---|---|---|---|
| 4,042,417 A | * | 8/1977 | Kaplow et al. | 136/246 |
| 4,280,853 A | * | 7/1981 | Palazzetti et al. | 136/246 |
| 4,297,521 A | * | 10/1981 | Johnson | 136/248 |
| D277,844 S | * | 3/1985 | Toews | D13/102 |
| 4,539,516 A | * | 9/1985 | Thompson | 320/101 |
| 4,994,941 A | * | 2/1991 | Wen | 362/26 |
| 5,253,300 A | * | 10/1993 | Knapp | 381/323 |
| 5,262,756 A | * | 11/1993 | Chien | 340/332 |
| 5,680,033 A | * | 10/1997 | Cha | 359/542 |
| 5,780,993 A | * | 7/1998 | Tsang | 320/111 |
| 6,127,797 A | * | 10/2000 | Walker | 320/101 |
| 6,310,461 B1 | * | 10/2001 | Romao | 320/114 |
| 7,388,146 B2 | * | 6/2008 | Fraas et al. | 136/246 |
| 8,134,332 B2 | * | 3/2012 | Lin et al. | 320/101 |
| 2003/0121541 A1 | * | 7/2003 | Hilton et al. | 136/244 |

FOREIGN PATENT DOCUMENTS

JP 11-299528 * 11/1999 ............ A45C 11/00

* cited by examiner

*Primary Examiner* — Thanh-Truc Trinh
(74) *Attorney, Agent, or Firm* — Imperium Patent Works; Amir V. Adibi

(57) ABSTRACT

A portable electronic device includes a housing including an outer surface and an inner surface. A core electronic component is configured to be provided inside of the housing. A transparent material is provided at the outer surface of the housing. A solar cell is provided on the inner surface of the housing and spaced apart from the transparent material by a predetermined distance. The transparent material is configured to receive light from an external source and direct the light to the solar cell.

5 Claims, 3 Drawing Sheets

SOLAR CELL CHARGER WITH LENS FOR PORTABLE APPLICATIONS

CROSS-REFERENCES TO RELATED APPLICATIONS

The present application claims priority to U.S. Patent Application No. 60/417,302, filed on Oct. 8, 2002, which is incorporated by reference.

BACKGROUND OF THE INVENTION

The present invention relates to a solar cell charger used in a portable device.

Recently, all types of electrical equipment have been miniaturized and converted to portable devices, e.g., notebook computer, personal digital assistant, mobile phone, and the like. These portable device require use of batteries for obvious reasons. A single-use batteries (e.g., dry-cell batteries) and rechargeable batteries (e.g., nickel-cadmium batteries) are well known battery power sources.

Today's portable electronic devices generally use rechargeable batteries for its convenience. Rechargeable batteries may be charged using alternating current (AC current) or solar energy. The alternating current requires a power socket that is connected to a power source. Accordingly, devices that use the AC currents to recharge generally cannot be used in outdoors. For this reason, it may be necessary to carry a spare battery if the portable device is to be used for extended time away from a power source.

Rechargeable solar energy batteries, however, can be charged generally anywhere, both indoors or outdoors, as long as there is light, thereby providing a greater flexibility to users. In addition, solar-cell batteries do not require any AC current conversion circuitry since only direct current is used, which simplifies circuitry and reduces manufacturing cost.

A typical solar cell based charger includes a solar cell, namely a photovoltaic device, batteries, associated electrical circuits, and the casing of the assembly. The solar cell 30 is generally mounted on the side of a container 10, as shown in FIG. 1. A core electronic component is provided within the container. When the core electronic component is inserted into the container via an opening 15, its batteries are charged with electrical energy by the battery module 20 of the container 10. The battery module 20 is charged by the solar cell 30. The battery module 20 contains power management electronic circuitry to operate as desired in these applications.

In a conventional technology, a solar cell is mounted on one of the external surfaces of the container, as shown in FIG. 1. In order for the solar cell to capture as much sun light as possible, it is desirable to cover as much of the surfaces of the container as possible with solar cells. The solar cell 30, having a lateral dimension of X, covers substantially all of the upper surface of the container 11 that has a lateral dimension Y. However solar cell material is more costly than the plastics, polymer, or metal that are generally used to make the container. In addition, solar cell material, especially, the semiconductor based solar cell, is brittle and may easily scratch or break in the daily handling of such a container.

BRIEF SUMMARY OF THE INVENTION

In one embodiment, a portable electronic device includes a housing including an outer surface and an inner surface. A core electronic component is configured to be provided inside of the housing. A transparent material is provided at the outer surface of the housing. A solar cell is provided on the inner surface of the housing and spaced apart from the transparent material by a predetermined distance. The transparent material is configured to receive light from an external source and direct the light to the solar cell.

In another embodiment, a housing for an electronic component includes an outer surface; an inner surface that is spaced apart from the outer surface by a first distance; and a light concentrator provided at the outer surface of the housing, the light concentrator including a first side and a second side. The inner surface is configured to receive a solar cell, the solar cell facing the first side of the light concentrator. The light concentrator is configured to focus light from an external source to the solar cell.

In yet another embodiment, a portable electronic device includes a housing including an outer surface and a lens provided at the outer surface of the housing; a solar cell component provided inside of the housing and spaced apart from the lens by a predetermined distance, the solar cell component having a smaller surface area than the lens; a battery module coupled to the solar cell component to store energy received from the solar cell; and an electronic circuit configured to perform a given function.

DETAILED DESCRIPTION OF THE INVENTION

The embodiments of the present invention relates to a portable electronic device that uses solar energy. A container of the portable device is provided with a smaller solar cell area without significantly compromising the energy charging capabilities of the device. The embodiments use the concept of light concentrators to reduce the size of the solar cell.

Figure 1:
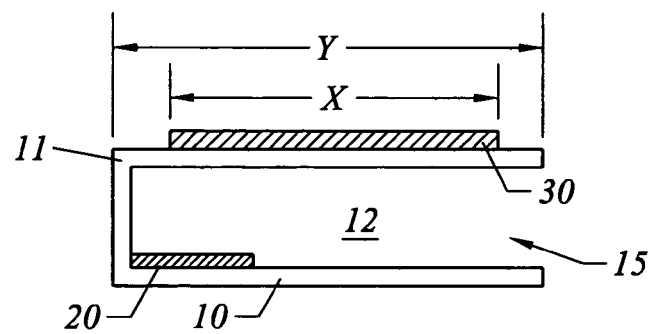
FIG. 1 illustrates a container to hold a portable electronic device.
Figure 2:
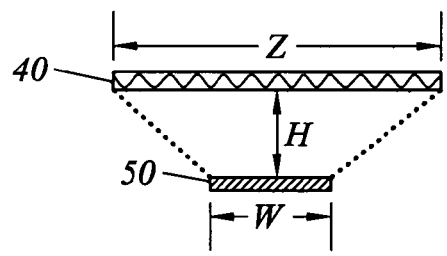
FIG. 2. illustrates a concept of using a light concentrator in conjunction with the a solar cell according to one embodiment of the present invention.

FIG. 2 illustrates the concept of providing an optical light concentrator or lens 40 between the incident light and a solar cell 50. Although the solar cell 50 is illustrated as a single cell for illustrative convenience, the solar cell 50 may include a plurality of cells in series or in array. The lens 40 can be a Fresnel type lens that is flat and can be produced from transparent, low cost polymer material. The lens 40 concentrates the light on a solar cell of smaller dimension than the lens. For example, a lateral dimension Z of the lens is several times larger than a lateral dimension W of the solar cell 50. In another embodiment, a ratio of Z to W is 1.2, 1.3, 1.5, 1.7, 1.9, 2.0, 2.5, 3.0, or greater.

The use of a lens requires a separation space between the lens and the solar cell according to the depth of focus (or focal distance) of the lens. That separation space is represented as H in FIG. 2.

Figure 3:
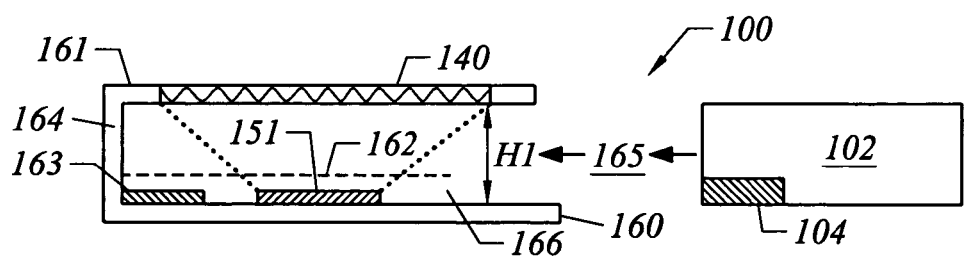
FIG. 3 illustrates a housing for a portable electronic device according to one embodiment of the present invention.

FIG. 3 illustrates a portable electronic device 100 according to one embodiment of the present invention. The device 100 may be a phone, personal digital assistant, calculator, or the like. The device 100 includes a core electronic component 102 and a portable electronic device container 160. A solar cell 151 is provided inside the container and facing a lens 140. The lens is formed on an outer surface of the container 160. The lens concentrates light onto the solar cell. The lens is a distance H1 away from the solar cell for desired effective light concentration, thus enabling the solar cell to operate at higher conversion efficiency for charging a container battery module (battery component) 163 of the container.

By using a low cost lens as part of the container and a smaller size solar cell, the container may be manufactured at a lower price. In addition, by placing the solar cell inside of the container 160, the solar cell is protected from mechanical damages due to impact or scratches resulting from daily handling of the container. A structural guide or spacer 162 are built inside of the container 160 to protect the solar cell 151 from a core electronic component 102 that may be inserted therein via an opening 165. Other techniques can be used, like a transparent plastic barrier or layer 166 that covers fully or partially the solar cell.

Figure 4:
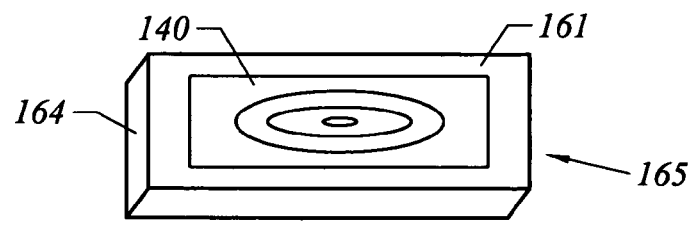
FIG. 4. illustrates a top plan view of the housing of FIG. 3 according to one embodiment of the present invention.

In one embodiment, the device 100 may be used while the component 102 is docked into the container or undocked from the container. That is, the core component 102 is itself a self-contained, operating electronic device. When the component 102 is docked into the container, an internal battery module 104 of the component is charged by the container battery module 163. The component 102 may also be used while undocked from the container. The container battery module 163 may be charged during such a time. FIG. 4 illustrates a top view of the container with the lens 140 as part of the container 161.

Figure 5:
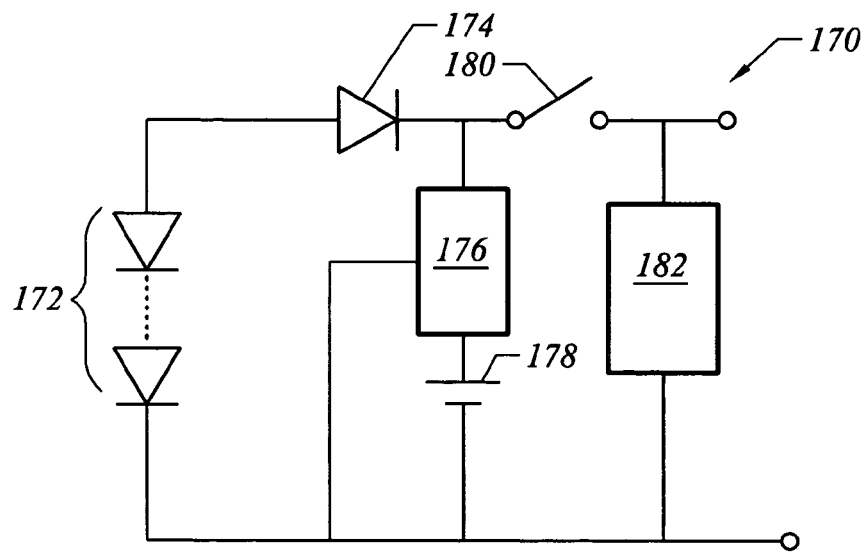
FIG. 5 illustrates a solar cell charger circuit for a portable electronic device according to one embodiment of the present invention.

FIG. 5 illustrates a battery charger circuit 170 of the device 100 according to one embodiment of the present invention. The circuit 170 includes a solar battery component 172 and a diode 174 for preventing a reverse flow of energy generated by the solar battery component 172, and an overvoltage or overcurrent protection circuit 176. A battery component 178, e.g., lithium ion battery, stores the energy from the solar battery component 172 via the diode and protection circuit. In certain application, the protection circuit is not needed. A switch 180 is turned on to charge an internal battery component 182 that is provided within the core electronic component. In one embodiment, the docking of the core component automatically forms an electrical connection between the core component and the battery component 178.

Figure 6:
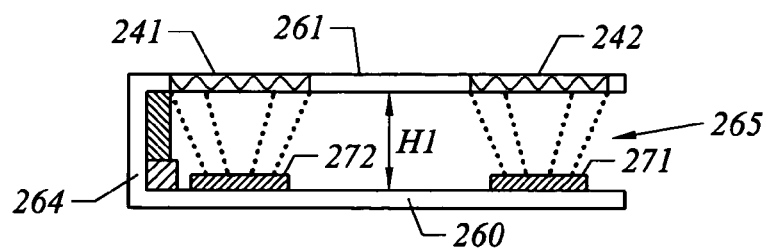
FIG. 6 illustrates a housing for a portable electronic device according to another embodiment of the present invention.

FIG. 6 illustrates a container 261 including a plurality of lens 241 and 242 and a plurality of solar cells 271 and 272 according to one embodiment of the present invention. The lenses and solar cells are separated by a distance H1. A container battery module 264 is provided inside the container. The container has an opening 265 for docking or undocking a core electronic component (not shown). The material of the lens can be optimized for the desired product in color or transparency to give it the desired graphic effect for specific consumer markets.

Figure 7:
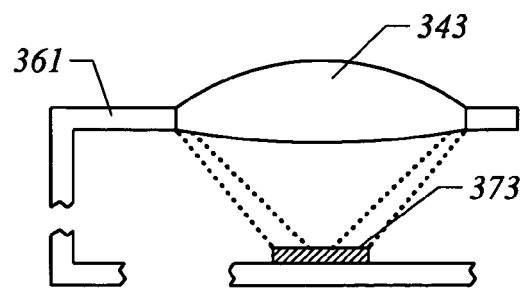
FIG. 7 illustrates a housing with a curved lens for a portable electronic device according to another embodiment of the present invention.

FIG. 7 illustrates a container 361 including a contoured or curved lens 343 according to one embodiment of the present invention. Light is focused onto a solar cell 373. In this embodiment, a lateral dimension of the lens is greater than a lateral dimension of the solar cell.

Figure 8:
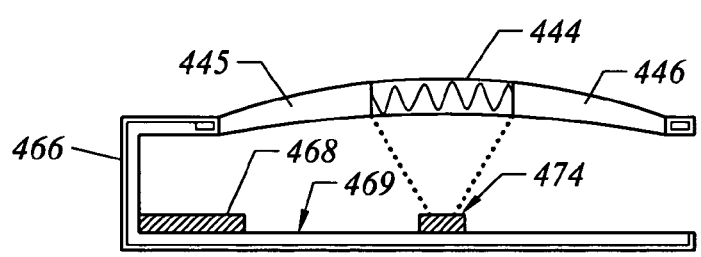
FIG. 8 illustrates a housing with a skylight structure for a portable electronic device according to another embodiment of the present invention.

FIG. 8 illustrates a container 466 for use in larger electronic instruments or equipment according to one embodiment of the present invention. The container surface can be structured like a "skylight" with part of it shaped as a lens 444 of desired configuration. Only a portion of the area that receives light may be provided with a solar cell 474 if the remaining portion of the entire area is needed for other uses, e.g., for various electronic components of the electric equipment. Portions 445 and 446 of the container 466 are also made of a transparent material but are not used as lenses in this embodiment. These portions are merely used as skylights to provide illumination to an area 469 that is part of the internal cavity of the container 466. A container battery module 468 is provided inside the container to store the energy generated by the solar cell 474.

Figure 9:
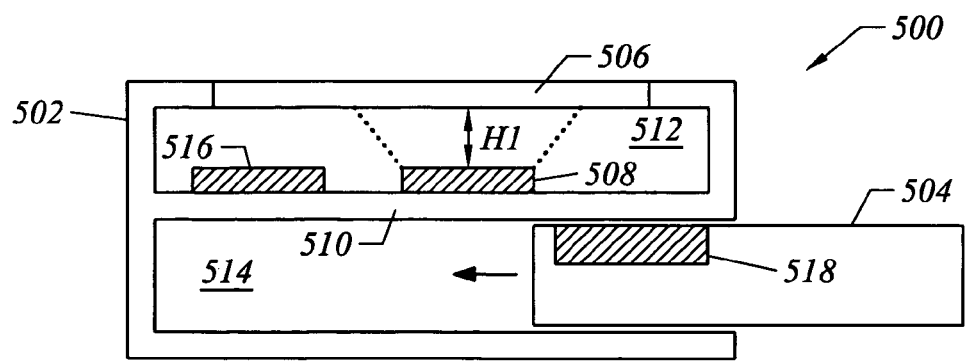
FIG. 9 illustrates a portable electronic device including a housing and an electronic component according to another embodiment of the present invention.

FIG. 9 illustrates an portable electronic device 500 including a housing 502 and an electronic component 504 according to one embodiment of the present invention. The housing includes a lens 506 provided on an outer surface of the housing and a divider 510 provided inside the housing. The divider 510 separates the housing into two compartments: a solar cell compartment 512 and a main compartment 514. The solar cell compartment 512 includes a solar cell 508 that is provided below the lens 506, separated by an optimum distance H1 for focusing light onto the solar cell. A housing battery module 516 is provided within the solar cell compartment. In other applications, the battery module 516 may be provided in the main compartment.

The main compartment 514 stores the electronic component 504 that performs core functions of the device 500. The electronic component 504 is configured to be docked into or undocked from the main compartment in the present embodiment. When the component is docked into the compartment, an internal battery module 518 provided inside of the electronic component 504 couples to the housing battery module to receive energy from the housing battery module.

In another embodiment, the electronic component 504 is securely attached to the housing 502, so that the device 500 is configured to be used with the component 504 provided inside of the housing. In such an embodiment, the device 500 may not require the internal battery module 518 or the divider 510, or both.

The present invention has been described in terms of the specific embodiments above. These embodiments are used merely to illustrate the invention and may be modified or altered without departing from the scope of the present invention. Accordingly, the scope of the invention is defined using the appended claims.

What is claimed is:

1. A portable solar-powered charger comprising a housing and a removable rectangular electronic component configured to be received by the housing, wherein the housing includes:
   a lens provided on a top outer surface of the housing;
   a divider provided inside the housing to divide the housing into a solar cell compartment and a main compartment directly below the solar cell compartment, wherein the solar cell compartment has a solar cell separated by a predetermined distance below the lens to receive the concentrated light from the lens, and wherein the main compartment has an opening to receive the removable rectangular electronic component inside the main compartment; and a battery module provided within the solar cell compartment to be charged by the solar cell;

wherein the removable rectangular electronic component includes an internal battery inside the removable rectangular electronic component and is configured to be docked into or undocked from the main compartment such that when the removable electronic component is docked into the main compartment the internal battery couples to the battery module to receive energy from the battery module; and wherein the removable rectangular electronic component is selected from the group consisting of a phone, a personal digital assistant, and a calculator.

2. The portable solar-powered charger of claim 1, wherein the divider has an upper surface and a lower surface, wherein the solar cell and the battery module are disposed above the upper surface of the divider, and wherein the removable rectangular electronic component is disposed below the lower surface of the divider after the removable rectangular electronic component is received onto the main compartment.

3. The portable solar-powered charger electronic device container of claim 1, wherein the lens is a Fresnel type lens produced from a transparent polymer material.

4. The portable solar-powered charger of claim 1, wherein the lens has a lateral dimension Z, wherein the solar cell has a lateral dimension W, and wherein a ratio of Z to W is a value selected from the group consisting of: 1.2, 1.3, 1.5, 1.7, 1.9, 2.0, 2.5, and 3.0.

5. The portable solar-powered charger of claim 1, wherein the housing further comprises a second lens formed on the top outer surface of the housing and a second solar cell disposed below the second lens, wherein the second solar cell is contained within the solar cell compartment to receive concentrated light from the second lens to charge the battery module.

* * * * *

UNITED STATES PATENT AND TRADEMARK OFFICE
CERTIFICATE OF CORRECTION

| | | |
|---|---|---|
| PATENT NO. | : 9,012,764 B1 | Page 1 of 1 |
| APPLICATION NO. | : 10/682384 | |
| DATED | : April 21, 2015 | |
| INVENTOR(S) | : Nathan Zommer | |

It is certified that error appears in the above-identified patent and that said Letters Patent is hereby corrected as shown below:

In the Claims:

Column 6, lines 3-4, the words "electronic device container" should be deleted.

The text of column 6, lines 3-5 should now read:

3. The portable solar-powered changer of claim 1, wherein the lens is a Fresnel type lens produced from a transparent polymer material.

Signed and Sealed this
Fourth Day of August, 2015

Michelle K. Lee
*Director of the United States Patent and Trademark Office*